US012777694B2

(12) United States Patent
Imamura et al.

(10) Patent No.: US 12,777,694 B2
(45) Date of Patent: Oct. 27, 2026

(54) NITRIDE SEMICONDUCTOR DEVICE AND METHOD FOR MANUFACTURING NITRIDE SEMICONDUCTOR DEVICE

(71) Applicant: Mitsubishi Electric Corporation, Tokyo (JP)

(72) Inventors: Ken Imamura, Tokyo (JP); Shuichi Hiza, Tokyo (JP); Kunihiko Nishimura, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 422 days.

(21) Appl. No.: 18/274,223

(22) PCT Filed: Feb. 17, 2021

(86) PCT No.: PCT/JP2021/005869

§ 371 (c)(1),
(2) Date: Jul. 26, 2023

(87) PCT Pub. No.: WO2022/176051

PCT Pub. Date: Aug. 25, 2022

(65) Prior Publication Data

US 2024/0096968 A1 Mar. 21, 2024

(51) Int. Cl.
*H10D 62/85* (2025.01)
*H10D 62/83* (2025.01)
(Continued)

(52) U.S. Cl.
CPC ..... *H10D 62/8503* (2025.01); *H10D 62/8303* (2025.01); *H10P 14/3416* (2026.01); *H10P 50/73* (2026.01); *H10W 20/082* (2026.01)

(58) Field of Classification Search
None
See application file for complete search history.

(56) References Cited

U.S. PATENT DOCUMENTS 4,794,093 A * 12/1988 Tong ..................... H01L 21/743 257/E23.105
4,807,022 A * 2/1989 Kazior .................. H01L 21/743 257/E23.101

(Continued)

FOREIGN PATENT DOCUMENTS

JP 2008-258281 A 10/2008
JP 2011040597 A 2/2011

OTHER PUBLICATIONS

Extended European Search Report issued Mar. 5, 2024 in European Patent Application No. 21926491.8, 8 pages.

(Continued)

*Primary Examiner* — Erik T. K. Peterson
(74) *Attorney, Agent, or Firm* — XSENSUS LLP

(57) ABSTRACT

It is an object of the present disclosure to impart desired high frequency characteristics to a nitride semiconductor device including diamond as a substrate at a low cost. In the nitride semiconductor device according to the present disclosure, a via hole extends from a first main surface of a diamond layer through the diamond layer, an intermediate layer, and a nitride semiconductor layer to an electrode. The via hole has a multi-step structure including a large-diameter via hole being in contact with the first main surface of the diamond layer and a small-diameter via hole facing the electrode, having a smaller diameter than the large-diameter via hole, and being tapered.

13 Claims, 6 Drawing Sheets

(51) Int. Cl.
*H10P 14/20* (2026.01)
*H10P 50/00* (2026.01)
*H10W 20/00* (2026.01)

(56) References Cited

U.S. PATENT DOCUMENTS

| | | | | |
|---|---|---|---|---|
| 5,037,782 | A | 8/1991 | Nakamura et al. | |
| 5,334,306 | A * | 8/1994 | Dautremont-Smith | H01L 21/4803 205/159 |
| 5,438,212 | A | 8/1995 | Okaniwa | |
| 7,233,028 | B2 * | 6/2007 | Weeks | H10F 71/1274 257/E29.022 |
| 7,834,461 | B2 * | 11/2010 | Asai | H10D 10/821 257/769 |
| 8,143,654 | B1 | 3/2012 | Saunier | |
| 8,674,405 | B1 | 3/2014 | Dubravko et al. | |
| 9,281,446 | B2 * | 3/2016 | Suh | H10H 20/825 |
| 9,589,917 | B1 * | 3/2017 | Rodriguez | H01L 23/647 |
| 2006/0046463 | A1 * | 3/2006 | Watkins | H01L 21/76898 257/E21.597 |
| 2010/0059791 | A1 * | 3/2010 | Takagi | H10D 30/00 257/E21.585 |
| 2010/0308469 | A1 * | 12/2010 | Tsai | H01L 23/5226 257/E21.585 |
| 2012/0119374 | A1 * | 5/2012 | Rahman | H01L 23/481 257/774 |
| 2014/0084375 | A1 * | 3/2014 | Lee | H01L 23/522 257/621 |
| 2014/0141595 | A1 | 5/2014 | Babic et al. | |
| 2014/0264917 | A1 * | 9/2014 | Huang | H01L 23/481 257/774 |
| 2014/0295581 | A1 * | 10/2014 | Hoff | H01L 21/268 438/7 |
| 2017/0271281 | A1 * | 9/2017 | Rodriguez | G01S 7/032 |
| 2020/0098634 | A1 * | 3/2020 | Tsunami | H01L 21/3085 |
| 2021/0249512 | A1 * | 8/2021 | Lee | H01L 21/0254 |
| 2022/0141961 | A1 * | 5/2022 | Wu | H05K 1/116 174/258 |
| 2022/0148941 | A1 * | 5/2022 | Yoshitsugu | H10D 30/47 |

OTHER PUBLICATIONS

International Search Report and Written Opinion mailed on May 11, 2021, received for PCT Application PCT/JP2021/005869, filed on Feb. 17, 2021, 10 pages including English Translation.

Lee et al., "A Trapping Behavior of GaN on Diamond HEMTs for Next Generation 5G Base Station and SSPA Radar Application", International Journal of Internet, Broadcasting and Communication, vol. 12, No. 2, Mar. 2, 2020, pp. 30-36.

Office Action and Search Report issued Jul. 17, 2026 in corresponding Chinese patent application No. 202180093557.2 (19 pages; with English translation).

* cited by examiner

NITRIDE SEMICONDUCTOR DEVICE AND METHOD FOR MANUFACTURING NITRIDE SEMICONDUCTOR DEVICE

CROSS-REFERENCE TO RELATED APPLICATION

The present application is based on PCT filing PCT/JP2021/005869, filed Feb. 17, 2021, the entire contents of which are incorporated herein by reference.

TECHNICAL FIELD

The present disclosure relates to a nitride semiconductor device.

BACKGROUND ART

As a semiconductor device that operates at high power and in a high frequency region, a field effect transistor (FET) made of a nitride semiconductor and the like are conventionally used. However, a phenomenon of an increase in temperature of the interior of the semiconductor device during high power operation to reduce characteristics or reliability of the device has been problematic.

To suppress the increase in temperature of the interior of the semiconductor device, it is important to dispose a material or a structure having high heat dissipation near a heat generator. Diamond has the highest thermal conductivity of all solid substances, and is an optimum heat dissipation material.

As a semiconductor device expected to have a high heat dissipation effect, a structure in which a substrate of the semiconductor device as a whole is replaced with diamond, that is, diamond is used as a heat spreader is known. It is difficult to grow the nitride semiconductor directly over diamond, so that a structure in which diamond is grown over or applied to the nitride semiconductor via an intermediate layer is used. A GaN on Diamond structure in which gallium nitride (GaN) is used as the nitride semiconductor is well known.

It is necessary to form a via hole to impart desired high frequency characteristics with such a structure. The via hole is typically formed to provide contact between a front surface electrode and a back surface of a semiconductor substrate, and is formed by forming an opening by etching from the back surface of the semiconductor substrate and covering the interior of the opening with a metal layer. Such a configuration allows for omission of a wire bonding structure, reduction in source inductance, and, further, higher performance due to improvement in high frequency characteristics.

PRIOR ART DOCUMENTS

Patent Document

Patent Document 1: Japanese Patent Application Laid-Open No. 2008-258281

Non-Patent Document

Non-Patent Document 1: "A Trapping Behavior of GaN on Diamond HEMTs for Next Generation 5G Base Station and SSPA Rader Application", International Journal of Internet, Broadcasting and Communication Vol. 12 No. 2 30-36 (2020).

SUMMARY

Problem to be Solved by the Invention

Patent Document 1 discloses a configuration in which a via hole extending between a front surface and a back surface of a semi-insulating substrate is a multi-step via hole including a small-diameter via hole on a side of the front surface and a large-diameter via hole on a side of the back surface. The multi-step via hole in Patent Document 1 is formed by dry etching. When diamond is used for the semi-insulating substrate, however, diamond has an extremely low etch rate as it is a difficult-to-etch material. This causes a problem in that formation of the via hole only by dry etching is time consuming, and increases costs.

Non-Patent Document 1 discloses formation of a tapered via in a high frequency device having a GaN on Diamond structure by laser drilling. In this case, there has been a problem in that conduction failure occurs due to a burr at an end of an opening of a via hole, roughness of a side wall of the via hole, and damage to an electrode pad, and desired high frequency characteristics cannot be imparted.

The present disclosure has been conceived to solve the above-mentioned problem, and it is an object of the present disclosure to impart desired high frequency characteristics to a nitride semiconductor device including diamond as a substrate at a low cost.

Means to Solve the Problem

A nitride semiconductor device according to the present disclosure includes: a diamond layer; a ground electrode disposed over a first main surface of the diamond layer; an intermediate layer disposed over a second main surface being a main surface opposite the first main surface of the diamond layer; a nitride semiconductor layer disposed over a surface of the intermediate layer opposite the diamond layer; and an electrode disposed over a surface of the nitride semiconductor layer opposite the intermediate layer. A via hole extends from the first main surface of the diamond layer through the diamond layer, the intermediate layer, and the nitride semiconductor layer to the electrode. The via hole has a multi-step structure including a large-diameter via hole being in contact with the first main surface of the diamond layer and a small-diameter via hole facing the electrode, having a smaller diameter than the large-diameter via hole, and being tapered.

Effects of the Invention

According to the nitride semiconductor device according to the present disclosure, desired high frequency characteristics can be imparted at a low cost. The objects, features, aspects and advantages of the present disclosure will become more apparent from the following detailed description and the accompanying drawings.

DESCRIPTION OF EMBODIMENTS

A. Embodiment 1

A-1. Configuration

Figure 1:
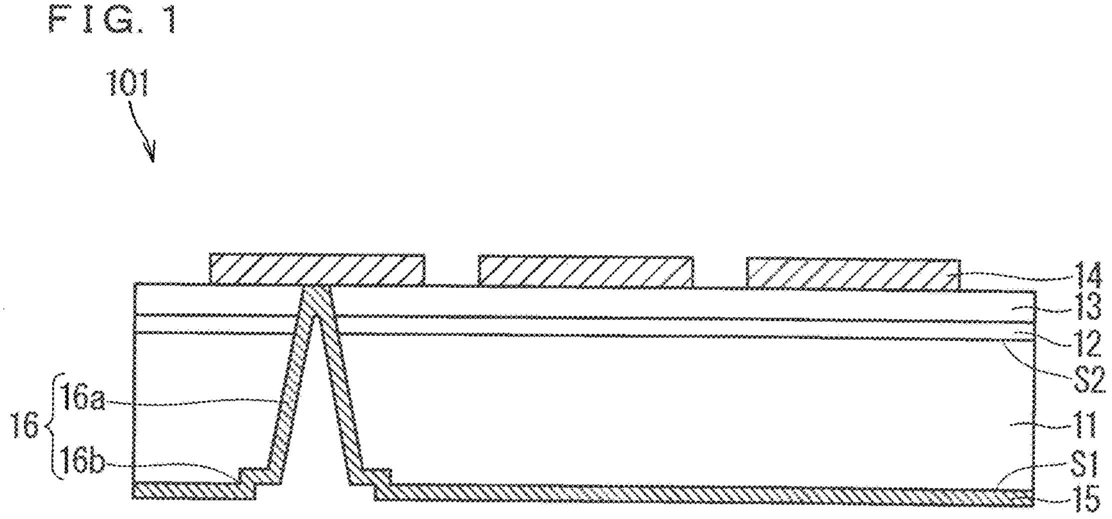
FIG. 1 is a cross-sectional view of a nitride semiconductor device in Embodiment 1.

FIG. 1 illustrates a cross-sectional structure of a nitride semiconductor device 101 in Embodiment 1. The nitride semiconductor device 101 includes a diamond layer 11, an intermediate layer 12, a nitride semiconductor layer 13, an electrode 14, and a ground electrode 15. The diamond layer 11 has a first main surface S1 and a second main surface opposite the first main surface S1. The nitride semiconductor layer 13 is stacked over the second main surface S2 of the diamond layer 11 via the intermediate layer 12. The electrode 14 includes a source electrode, a gate electrode, a drain electrode, and the like, and is disposed over a surface of the nitride semiconductor layer 13 opposite the intermediate layer 12. The ground electrode 15 is formed over the first main surface S1 of the diamond layer 11, which is a main surface opposite the second main surface S2.

A via hole 16 extending through the diamond layer 11, the intermediate layer 12, and the nitride semiconductor layer 13 is formed directly below the source electrode of the electrode 14 or an electrode pad connected to the source electrode, and the electrode 14 and the ground electrode 15 are electrically connected via the via hole 16.

Polycrystalline diamond or monocrystalline diamond is used for the diamond layer 11. The diamond layer 11 is preferably manufactured by chemical vaper deposition (CVD). The diamond layer 11 preferably has a thickness of 10 μm or more and 500 μm or less.

Si, an oxide of Si, or a nitride of Si is used for the intermediate layer 12. When the intermediate layer 12 is a conductor, high frequency characteristics of the nitride semiconductor device 101 are reduced, so that the intermediate layer 12 preferably has a resistivity of 0.1 μΩ or more. The intermediate layer 12 is only required to have a thickness of 1 nm or more and 100 nm or less. When the intermediate layer 12 has a large thickness, however, heat dissipation of the nitride semiconductor device 101 is reduced. The intermediate layer 12 thus preferably has a thickness of 1 nm or more and 40 nm or less.

A material for the nitride semiconductor layer 13 includes GaN, AlGaN, InAlN, AlN, and the like, for example. The nitride semiconductor layer 13 may be a single semiconductor layer made of any one of these materials, or may be a stack of a plurality of semiconductor layers made of two or more dissimilar materials selected from these materials. The nitride semiconductor layer 13 typically has a thickness of 10 μm or less, but may have a thickness of more than 10 μm.

Materials for the electrode 14 and the ground electrode 15 may each be a single metal element or an alloy. As the single metal element, one element selected from the group consisting of Cu, Ti, Al, Au, Ni, Nb, Pd, Pt, Cr, W, Ta, and Mo may be used. As the alloy, AuGe, AuGa, AuSn, and the like may be used. The electrode 14 and the ground electrode 15 may each be a stack of any of the above-mentioned materials.

A semiconductor device such as a high electron mobility transistor (HEMT) is formed by the nitride semiconductor layer 13 and the electrode 14.

The via hole 16 includes a small-diameter via hole **16*a* facing the electrode 14 and a large-diameter via hole 16*b* facing the ground electrode 15 and having a larger diameter than the small-diameter via hole 16*a*. The small-diameter via hole 16*a* is tapered to have a diameter decreasing with decreasing distance from the electrode 14 and increasing with decreasing distance from the large-diameter via hole 16*b***. A tapered shape refers to a shape having an angle formed by a bottom surface and a side surface of the via hole, that is, a taper angle of 90° or more.

A-2. Manufacturing Method

FIGS. 2 to 5 are cross-sectional views illustrating a method for manufacturing the nitride semiconductor device 101 in Embodiment 1. The method for manufacturing the nitride semiconductor device 101 will be described below with reference to FIGS. 2 to 5.

Figure 2:
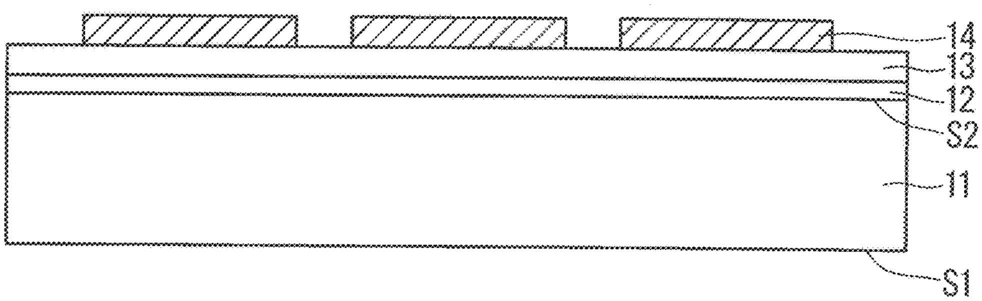
FIG. 2 is a cross-sectional view illustrating a method for manufacturing the nitride semiconductor device in Embodiment 1.

First, the nitride semiconductor layer 13 is formed over a substrate of Si and the like, and the electrode 14 is formed over the nitride semiconductor layer 13. The semiconductor device is thus formed by the nitride semiconductor layer 13 and the electrode 14. Next, the substrate is removed, and the second main surface S2 of the diamond layer 11 is bonded, via the intermediate layer 12, to a surface of the nitride semiconductor layer 13 from which the substrate has been removed. Surface activated bonding is used for bonding of the diamond layer 11. The intermediate layer 12 is made of Si, and has a thickness of 10 nm. The diamond layer 11 has a thickness of 100 μm. A stack of the diamond layer 11, the intermediate layer 12, the nitride semiconductor layer 13, and the electrode 14 illustrated in FIG. 2 is thus obtained.

Figure 3:
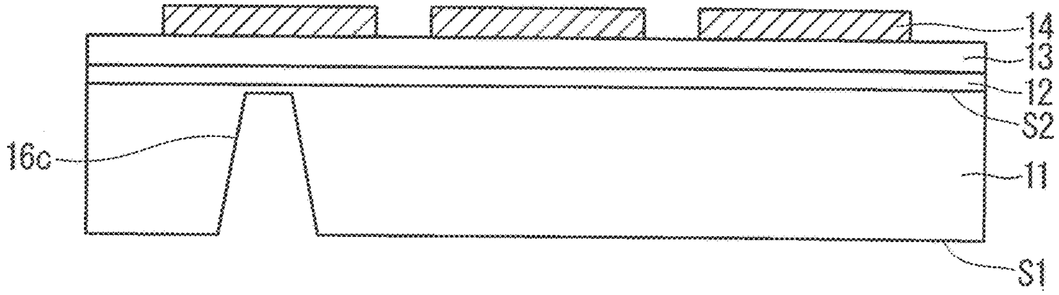
FIG. 3 is a cross-sectional view illustrating the method for manufacturing the nitride semiconductor device in Embodiment 1.

Next, as illustrated in FIG. 3, a position, on the first main surface S1 of the diamond layer 11, corresponding to the source electrode of the electrode 14 or the electrode pad connected to the source electrode is irradiated with a laser to remove a portion of the diamond layer 11 in a direction of the thickness to thereby form a via hole 16*c*. As illustrated in FIG. 3, the via hole 16*c* does not extends to the intermediate layer 12. The via hole 16*c* is a via hole during formation of the via hole 16, and is also referred to as a first via hole. As the laser, an Nd:YAG laser having a wavelength of 1064 nm is used.

Figure 6:
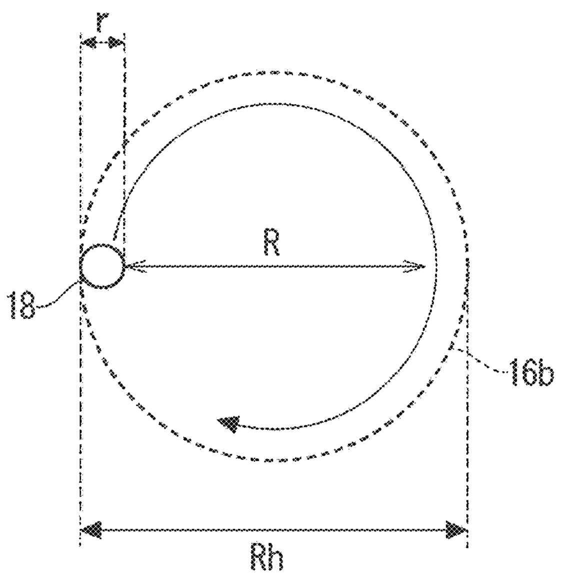
FIG. 6 is a diagram illustrating a method for forming a via hole in the nitride semiconductor device in Embodiment 1 using a laser.

FIG. 6 illustrates a method for processing the via hole 16*c* using the laser. The laser focused to have a laser diameter of 10 μm is scanned to describe a circle having a diameter R, and the scanning diameter R is gradually reduced in the same plane. With increasing depth of the via hole 16*c*, the scanning diameter R is gradually reduced, so that a diameter Rh of the via hole 16*c* gradually decreases, and the via hole 16*c* has a tapered cross section. Assume that the via hole 16*c* has a depth of 95 μm and an opening diameter of 65 μm.

Figure 4:
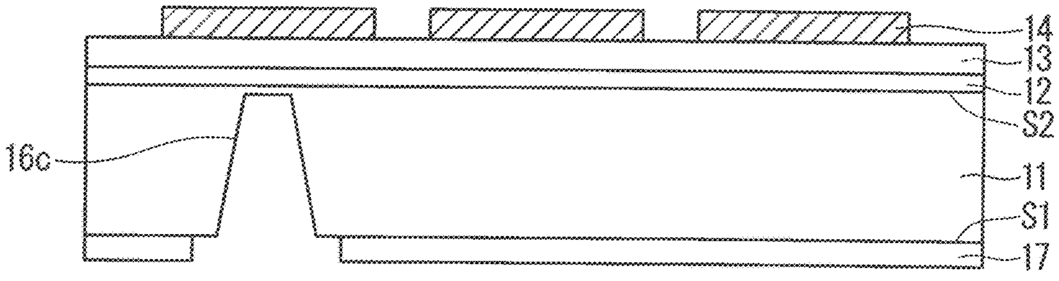
FIG. 4 is a cross-sectional view illustrating the method for manufacturing the nitride semiconductor device in Embodiment 1.

Next, as illustrated in FIG. 4, a metal mask 17 is formed over the first main surface S1 of the diamond layer 11. Assume that the metal mask 17 has an opening diameter of 80 μm, which is larger than the opening diameter of the via hole 16*c*, so that the via hole 16*c* formed in the preceding step falls within an opening of the metal mask 17. The metal mask 17 is formed by forming a feed layer using a stacked film of Ti and Au, then patterning the feed layer, and further forming a film of Ni by electroless plating.

Next, dry etching is performed using the metal mask 17 to etch remaining portions of the diamond layer 11, the intermediate layer 12, and the nitride semiconductor layer 13 to thereby form the via hole 16 including the small-diameter via hole 16*a* and the large-diameter via hole 16*b*. The via hole 16 is a via hole formed based on the via hole 16*c* as the first via hole, and is also referred to as a second via hole. An inductively coupled plasma (ICP) etching apparatus is used for dry etching. The diamond layer 11 and the intermediate layer 12 are etched with a mixed gas of O2, SF6, and Ar, and the nitride semiconductor layer 13 is etched with a mixed gas of Cl2, BCl3, and Ar. An etch depth is adjusted by adjusting an etch time. The thicknesses of the diamond layer 11, the intermediate layer 12, and the nitride semiconductor layer 13, the depth of the via hole 16*c*, and an etch rate of a material etched with each gas species are measured in advance, and the etch time is determined based on them.

By etching described above, a side surface and a bottom surface of the via hole 16*c* are etched to extend the via hole 16*c* through the intermediate layer 12 and the nitride semiconductor layer 13 to the electrode 14. The small-diameter via hole 16*a* is formed as described above. Since the side surface of the via hole 16*c* is etched, roughness of the side surface of the via hole 16*c* caused by laser processing is mitigated or removed. Furthermore, since the opening of the metal mask 17 is larger than an opening of the via hole 16*c* as described above, a portion of the first main surface S1 of the diamond layer 11 exposed from the opening of the metal mask 17 is also etched. The large-diameter via hole 16*b* is thus formed, and a burr in an opening portion of the via hole 16*c* caused by laser processing is removed. The small-diameter via hole 16*a* has a depth of 96 μm, and the large-diameter via hole 16*b* has a depth of 7 μm.

Figure 5:
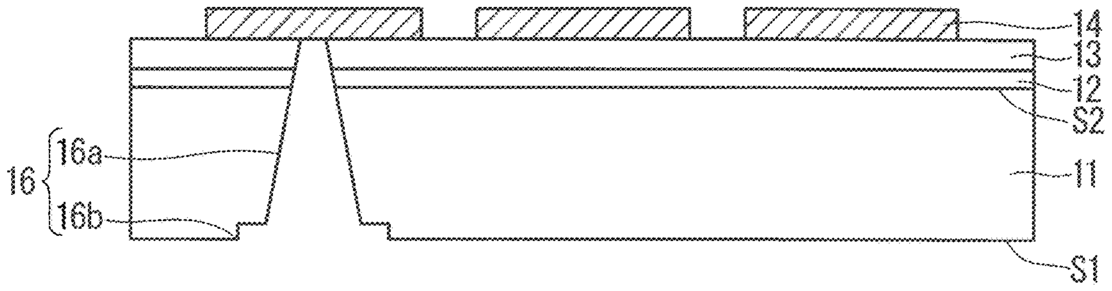
FIG. 5 is a cross-sectional view illustrating the method for manufacturing the nitride semiconductor device in Embodiment 1.

Then, as illustrated in FIG. 5, the metal mask 17 is removed by wet etching.

An example in which, after formation of the via hole 16*c* by laser processing, the metal mask 17 is formed, and dry etching is performed has been shown in description made above. The metal mask 17, however, may be formed before formation of the via hole 16*c*. In this case, when the via hole 16*c* is formed, a portion inward of an opening portion of the metal mask 17 is preferably irradiated with a laser so that the metal mask 17 is not irradiated to avoid damage to the metal mask 17.

Next, the ground electrode 15 is formed over the first main surface S1 of the diamond layer 11 and in the via hole 16. The nitride semiconductor device 101 illustrated in FIG. 1 is thus completed.

A-3. Effects

The nitride semiconductor device 101 in Embodiment 1 includes: the diamond layer 11; the ground electrode 15 disposed over the first main surface S1 of the diamond layer 11; the intermediate layer 12 disposed over the second main surface S2 of the diamond layer 11, which is the main surface opposite the first main surface S1; the nitride semiconductor layer 13 disposed over the surface of the intermediate layer 12 opposite the diamond layer 11; and the electrode 14 disposed over the surface of the nitride semiconductor layer 13 opposite the intermediate layer. The via hole 16 extends from the first main surface S1 of the diamond layer 11 through the diamond layer 11, the intermediate layer 12, and the nitride semiconductor layer 13 to the electrode 14. The via hole 16 has the multi-step structure including the large-diameter via hole 16*b* being in contact with the first main surface S1 of the diamond layer 11 and the small-diameter via hole 16*a* facing the electrode 14, having a smaller diameter than the large-diameter via hole 16*b*, and being tapered.

Such a via hole 16 can be formed by first forming a via hole having a certain depth from the first main surface S1 by laser processing, and then removing a layer remaining at a bottom of the via hole and a portion around an opening of the via hole by dry etching. The diamond layer 11 is thus not required to be removed only by dry etching when the via hole 16 is formed, so that the via hole 16 can be formed in a short time. The via hole does not extend through the nitride semiconductor layer 13 by laser processing, so that damage of the laser to the electrode 14 is avoided. The burr or roughness in cross section of the via hole caused by laser processing is mitigated or removed by dry etching thereafter. As a result, the via hole 16 provides good conduction between the electrode 14 and the ground electrode 15. An increase in source inductance is thus suppressed, and high frequency characteristics do not deteriorate.

The method for manufacturing the nitride semiconductor device 101 includes: (a) forming the via hole 16*c* as the first via hole extending from the first main surface S1 of the diamond layer 11, which is the surface opposite the intermediate layer 12, not to the electrode 14 in the stack of the diamond layer 11, the intermediate layer 12, the nitride semiconductor layer 13, and the electrode 14 stacked in this order by laser processing; (b) forming the metal mask 17 having the opening from which the via hole 16*c* as a whole and the portion of the first main surface S1 of the diamond layer 11 adjacent to the via hole 16*c* are exposed and which has a larger diameter than the via hole 16*c*; (c) processing the via hole 16*c* into the via hole 16 as the second via hole by dry etching with the metal mask 17; and (d) forming the ground electrode 15 over the first main surface S1 of the diamond layer 11 and in the via hole 16. In the step (c), the via hole 16 is formed to have the multi-step structure including the large-diameter via hole 16*b* formed by removing the portion of the first main surface S1 of the diamond layer 11 exposed from the opening of the metal mask 17 and the small-diameter via hole 16*a* formed by extending the via hole 16*c* to the electrode 14, having a smaller diameter than the large-diameter via hole 16*b*, and being tapered. The burr or roughness in cross section of the via hole 16*c* caused by laser processing in the step (a) is thus mitigated or removed by dry etching in the step (c) thereafter. Only a portion of the diamond layer 11 is removed by laser processing in the step (a), so that the laser causes no damage to the electrode 14. As a result, the via hole 16 provides good conduction between the electrode 14 and the ground electrode 15, the increase in source inductance is suppressed, and high frequency characteristics do not deteriorate. An etch rate in dry etching of the diamond layer 11 is extremely low, so that the via hole 16 can be formed in a shorter time compared with a case where the via hole 16 is formed only by dry etching.

B. Embodiment 2

According to the method for manufacturing the nitride semiconductor device 101 in Embodiment 1, the intermediate layer 12 is etched by dry etching after formation of the via hole 16*c*. This sometimes recesses the intermediate layer 12 not only in a direction of the thickness but also in a planer direction perpendicular to the direction of the thickness to notch a side surface of the via hole 16 in the intermediate layer 12. As a result, it becomes difficult to cover the side surface of the via hole 16 with the ground electrode 15, and conduction failure might occur.

A method for manufacturing the nitride semiconductor device in Embodiment 2 differs from that in Embodiment 1 in that a via hole 26*c* formed by laser processing extends from the diamond layer 11 through the intermediate layer 12 to the nitride semiconductor layer 13.

B-1. Configuration

Figure 7:
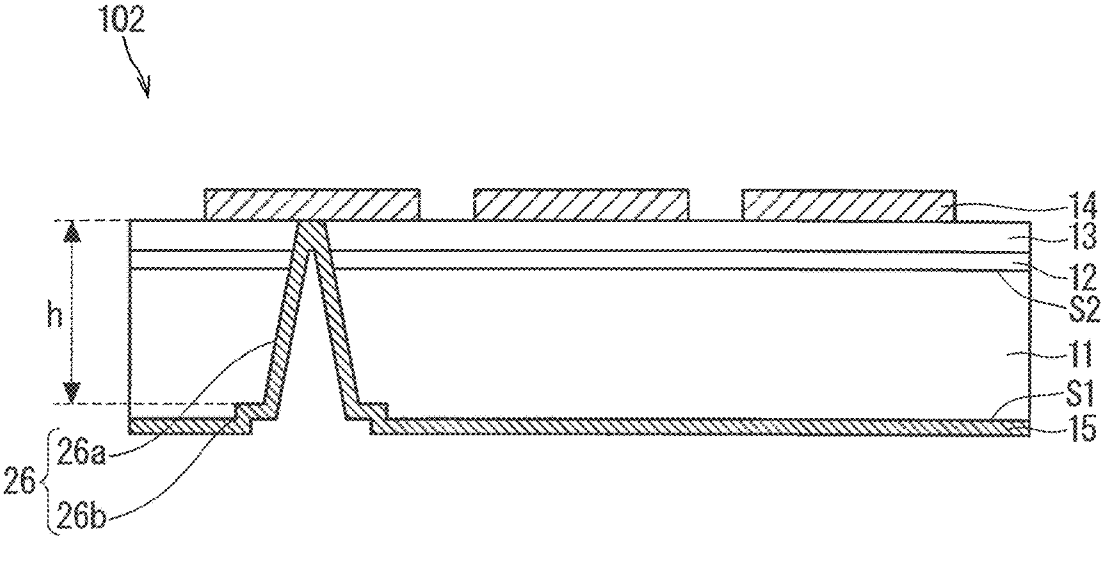
FIG. 7 is a cross-sectional view of a nitride semiconductor device in Embodiment 2.

FIG. 7 is a cross-sectional view of a nitride semiconductor device 102 in Embodiment 2. The nitride semiconductor device 102 is characterized in that a depth h of a small-diameter via hole 26*a* is greater than the sum of thicknesses of the diamond layer 11 and the intermediate layer 12. The nitride semiconductor device 102 differs from the nitride semiconductor device 101 in Embodiment 1 only in that a via hole 26 is formed in place of the via hole 16.

The via hole 26 includes the small-diameter via hole 26*a* facing the electrode 14 and a large-diameter via hole 26*b* facing the ground electrode 15 and having a larger diameter than the small-diameter via hole 26*a*. The small-diameter via hole 26*a* is tapered to have a diameter decreasing with decreasing distance from the electrode 14 and increasing with decreasing distance from the large-diameter via hole 26*b*. The depth h of the small-diameter via hole 26*a* is greater than the sum of the thicknesses of the diamond layer 11 and the intermediate layer 12.

B-2. Manufacturing Method

FIGS. 8 to 11 are cross-sectional views illustrating a method for manufacturing the nitride semiconductor device 102 in Embodiment 2. The method for manufacturing the nitride semiconductor device 102 will be described below with reference to FIGS. 8 to 11.

Figure 8:
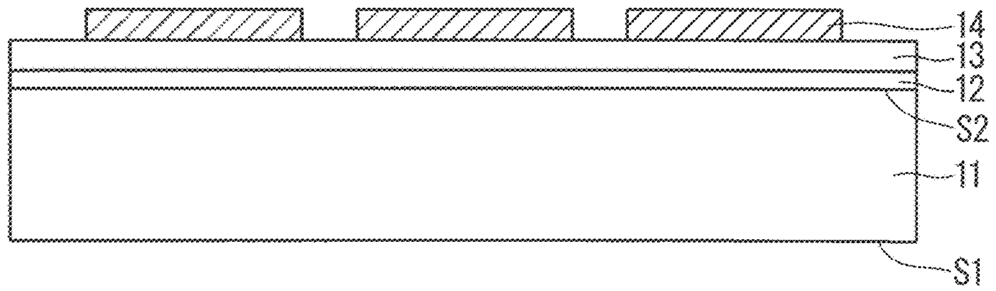
FIG. 8 is a cross-sectional view illustrating a method for manufacturing the nitride semiconductor device in Embodiment 2.

First, as illustrated in FIG. 8, the stack of the diamond layer 11, the intermediate layer 12, the nitride semiconductor layer 13, and the electrode 14 is formed as in Embodiment 1.

Figure 9:
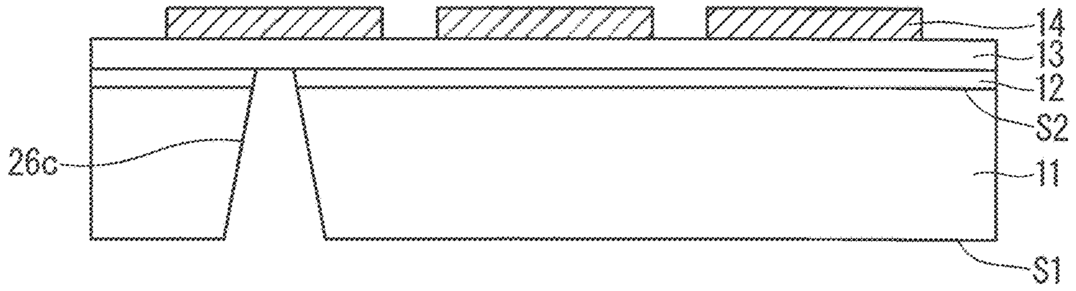
FIG. 9 is a cross-sectional view illustrating the method for manufacturing the nitride semiconductor device in Embodiment 2.

Next, as illustrated in FIG. 9, the position, on a surface opposite the intermediate layer 12, that is, the first main surface S1 of the diamond layer 11, corresponding to the source electrode of the electrode 14 or the electrode pad connected to the source electrode is irradiated with the laser to form the via hole 26*c* extending through the diamond layer 11 and the intermediate layer 12 to the nitride semiconductor layer 13. The via hole 26*c* is a via hole during formation of the via hole 26, and is also referred to as the first via hole. A laser processing depth can herein be controlled by evaluating a processing depth of diamond and a material for the intermediate layer 12 in advance. Assume that the via hole 26*c* herein has a depth of 101 μm.

Figure 10:
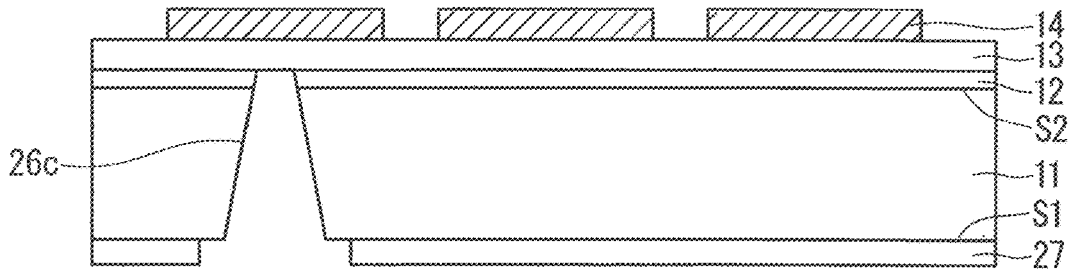
FIG. 10 is a cross-sectional view illustrating the method for manufacturing the nitride semiconductor device in Embodiment 2.

Next, as illustrated in FIG. 10, a metal mask 27 is formed over the first main surface S1 of the diamond layer 11. This step is similar to the step illustrated in FIG. 4 in Embodiment 1.

Next, dry etching is performed using the metal mask 27 to etch the nitride semiconductor layer 13. The ICP etching apparatus is used for dry etching. The nitride semiconductor layer 13 is etched with a mixed gas of Cl2 and BCl3.

By etching described above, a bottom surface of the via hole 26*c* is etched, and the via hole 26*c* extends through the nitride semiconductor layer 13 to the electrode 14. The small-diameter via hole 26*a* is formed as described above. A side surface of the via hole 26*c* is etched, so that roughness of the diamond layer 11 forming the side surface of the via hole 26*c* caused by laser processing is mitigated or removed. Furthermore, the opening of the metal mask 27 is larger than that of the via hole 26*c*, so that a portion of the first main surface S1 of the diamond layer 11 exposed from the opening of the metal mask 27 is also etched. Thus, the large-diameter via hole 26*b* is formed, and a burr in an opening portion of the via hole 26*c* caused by laser processing is removed. The small-diameter via hole 26*a* has a depth h of 102 μm, and the large-diameter via hole 26*b* has a depth of 1 μm. The via hole 26 including the small-diameter via hole 26*a* and the large-diameter via hole 26*b* is a via hole formed based on the via hole 26*c* as the first via hole, and is also referred to as the second via hole.

The depth h of the small-diameter via hole 26*a* has a value obtained by subtracting the depth of the large-diameter via hole 26*b* from the sum of the thicknesses of the diamond layer 11, the intermediate layer 12, and the nitride semiconductor layer 13. The depth of the large-diameter via hole 26*b* herein corresponds to the thickness of the diamond layer 11 removed while the entire thickness of the nitride semiconductor layer 13 is removed by dry etching. The diamond layer 11 has a lower etch rate than the nitride semiconductor layer 13, so that the depth of the large-diameter via hole 26*b* is smaller than the thickness of the nitride semiconductor layer 13. The depth h of the small-diameter via hole 26*a* is thus greater than the sum of the thicknesses of the diamond layer 11 and the intermediate layer 12.

Figure 11:
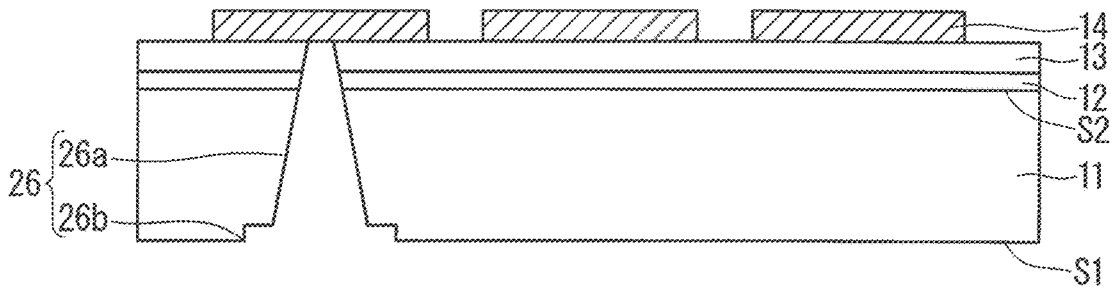
FIG. 11 is a cross-sectional view illustrating the method for manufacturing the nitride semiconductor device in Embodiment 2.

Then, as illustrated in FIG. 11, the metal mask 27 is removed by wet etching.

Next, the ground electrode 15 is formed over the first main surface S1, that is, a surface having an opening of the via hole 26 of the diamond layer 11. The nitride semiconductor device 102 illustrated in FIG. 7 is thus completed.

B-3. Effects

In the nitride semiconductor device 102 in Embodiment 2, the depth of the small-diameter via hole 26*a* is equal to or greater than the sum of the thicknesses of the intermediate layer 12 and the nitride semiconductor layer 13. Such a small-diameter via hole 26*a* is formed by forming the via hole 26*c* as the first via hole extending from the first main surface S1 of the diamond layer 11 through the diamond layer 11 and the intermediate layer 12 by laser processing, and then removing the nitride semiconductor layer 13 at a bottom of the via hole 26*c* and the first main surface S1 around the opening of the via hole 26*c* by dry etching. Although the intermediate layer 12 is exposed to an etch gas in a step of dry etching the nitride semiconductor layer 13, the intermediate layer 12 is less likely to be recessed in the planar direction as the intermediate layer 12 has a low etch rate for the etch gas. A side surface of the via hole 26 is thus less likely to be notched in the intermediate layer 12, and conduction failure of the via hole 26 is less likely to occur. As a result, reduction in high frequency characteristics is suppressed, and the nitride semiconductor device 102 can be manufactured with high yield.

In the method for manufacturing the nitride semiconductor device 102 in Embodiment 2, in the step (a), the via hole 26*c* as the first via hole is formed to extend through the diamond layer 11 and the intermediate layer 12 to the nitride semiconductor layer, and, in the step (c), a portion of the nitride semiconductor layer 13 overlapping the via hole 26*c* in plan view is removed to form the small-diameter via hole 26*a*. The intermediate layer 12 is removed by laser processing, so that the intermediate layer 12 is exposed to the etch gas in the step of dry etching the nitride semiconductor layer 13 thereafter, but is less likely to be recessed in the planar direction as the intermediate layer 12 has a low etch rate for the etch gas. The side surface of the via hole 26 is thus less likely to be notched in the intermediate layer 12, and conduction failure of the via hole 26 is less likely to occur. As a result, reduction in high frequency characteristics is suppressed, and the nitride semiconductor device 102 can be manufactured with high yield.

C. Embodiment 3

C-1. Configuration

Figure 12:
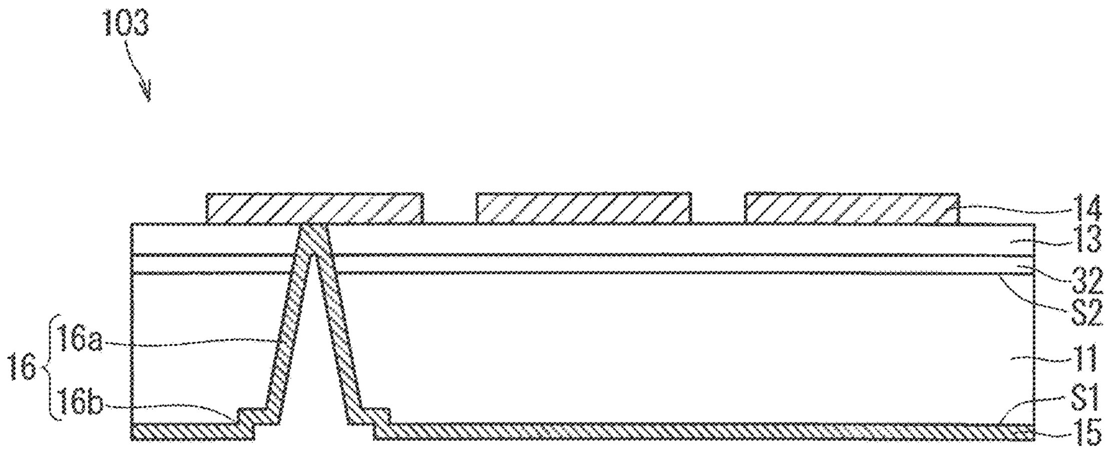
FIG. 12 is a cross-sectional view of a nitride semiconductor device in Embodiment 3.

FIG. 12 is a cross-sectional view of a nitride semiconductor device 103 in Embodiment 3. The nitride semiconductor device 103 differs from the nitride semiconductor device 101 in Embodiment 1 only in that an intermediate layer 32 is included in place of the intermediate layer 12.

In contrast to the intermediate layer 12, a difficult-to-etch material is used for the intermediate layer 32. The difficult-to-etch material is a material that is not easier to be etched than Si or SiN, and includes nanocrystalline diamond, an oxide or a carbide of Si, an oxide or a nitride of Al or Ti, an oxide of Hf or Zr, and the like as specific examples. The difficult-to-etch material is characterized in that a physical reaction predominates in dry etching. The difficult-to-etch material is also characterized by having an extremely low etch rate when dry etched with a Cl-based or an F-based gas. A high-temperature melting point material having a melting point of 1000° C. or more is typically likely to be the difficult-to-etch material.

There are two main principles of dry etching. The first is physical etching to perform sputtering by ions, and the second is chemical etching to perform reactive etching by a chemical reaction of the etch gas. The difficult-to-etch material can be processed by the former physical etching although an etch rate is low.

The intermediate layer 32 made of the difficult-to-etch material can be processed by physical etching.

C-2. Manufacturing Steps

Steps for manufacturing the nitride semiconductor device 103 in Embodiment 3 conform to steps for manufacturing the nitride semiconductor device 101 in Embodiment 1 or the nitride semiconductor device 102 in Embodiment 2.

In the former case, the intermediate layer 32 at a bottom of the via hole 16*c* can be removed by performing physical etching as dry etching. Assume that the intermediate layer 32 herein has a thickness of 10 nm and is made of AlN. The ICP etching apparatus is used for dry etching, and the diamond layer 11 and the intermediate layer 32 below the via hole 16*c* are etched with a mixed gas of Cl2 and Ar. The semiconductor layer 13 is then etched with a mixed gas of Cl2, BCl3, and Ar. The via hole 16 including the small-diameter via hole 16*a* and the large-diameter via hole 16*b* is thus obtained.

C-3. Effects

In the nitride semiconductor device 103 in Embodiment 3, the intermediate layer 32 is made of the difficult-to-etch material having a lower etch rate than Si or SiN in dry etching with the F-based gas or the Cl-based gas. Thus, when the via hole 16 is formed, the intermediate layer 32 is not recessed in the planar direction during etching of the nitride semiconductor layer 13. The side surface of the via hole 16 is thus not notched in the intermediate layer 32, so that conduction failure of the via hole 16 is avoided. As a result, reduction in high frequency characteristics is avoided, and the nitride semiconductor device 103 can be manufactured with high yield.

D. Embodiment 4

D-1. Configuration

In the nitride semiconductor devices 101 and 102 in Embodiments 1 and 2, conduction failure of the via holes 16 and 26 sometimes occurs as a result of the intermediate layers 12 and 32 being recessed during etching of the nitride semiconductor layer 13.

Figure 13:
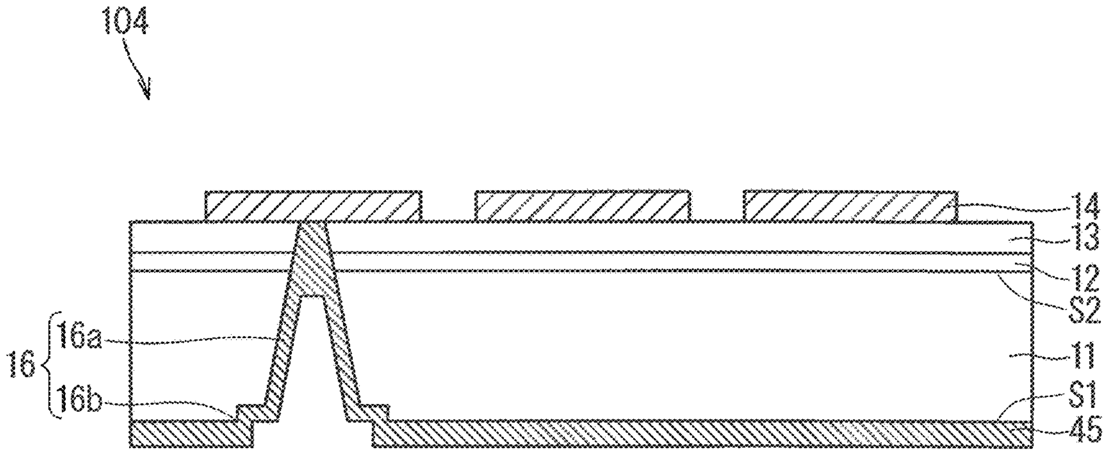
FIG. 13 is a cross-sectional view of a nitride semiconductor device in Embodiment 4.

FIG. 13 is a cross-sectional view of a nitride semiconductor device 104 in Embodiment 4. The nitride semiconductor device 104 differs from the nitride semiconductor device 101 in Embodiment 1 in that a ground electrode 45 is included in place of the ground electrode 15. A thickness of the ground electrode 45 at a bottom of the via hole 16 is equal to or greater than the sum of the thicknesses of the nitride semiconductor layer 13 and the intermediate layer 12.

D-2. Manufacturing Method

A method for manufacturing the nitride semiconductor device 104 in Embodiment 4 conforms to that in Embodiment 1 or in Embodiment 2. The thickness of the ground electrode 45 at the bottom of the via hole 16, however, can be increased by increasing a plating thickness when the ground electrode 45 is formed.

D-3. Modification

Figure 14:
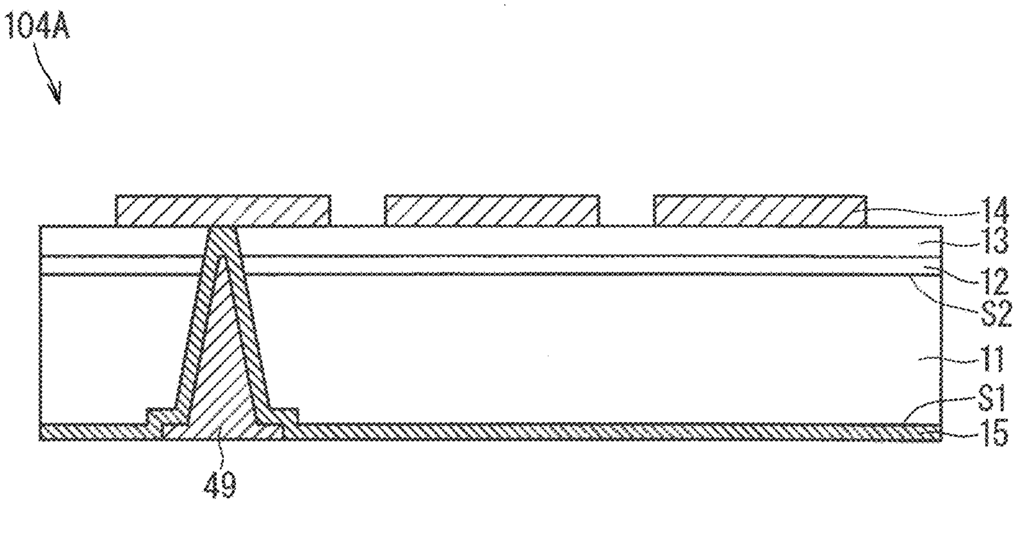
FIG. 14 is a cross-sectional view of a nitride semiconductor device in a modification of Embodiment 4.

FIG. 14 is a cross-sectional view of a nitride semiconductor device 104A in a modification of Embodiment 4. The nitride semiconductor device 104A includes an embedded layer 49 embedded in the via hole 16 in addition to the configuration of the nitride semiconductor device 101. While FIG. 14 illustrates a state in which the via hole 16 is completely filled with the embedded layer 49, the embedded layer 49 is only required to be embedded at least in the bottom of the via hole 16, and the sum of thicknesses of the ground electrode 15 at the bottom of the via hole 16 and the embedded layer 49 is only required to be equal to or greater than the sum of the thicknesses of the nitride semiconductor layer 13 and the intermediate layer 12.

The embedded layer 49 may be made of a single metal element or an alloy. As the single metal element, one element selected from the group consisting of Cu, Ti, Al, Au, Ni, Nb, Pd, Pt, Cr, W, Ta, and Mo may be used. As the alloy, AuGe, AuGa, AuSn, and the like may be used.

The embedded layer 49 can be embedded in the via hole 16 by forming a feed layer over the first main surface S1 of the diamond layer 11 and in the via hole 16, and performing plating while leaving the feed layer only in the via hole 16 by patterning.

D-4. Effects

In the nitride semiconductor device 104 in Embodiment 4, the thickness of the ground electrode 45 at the bottom of the via hole 16 facing the electrode 14 is equal to or greater than the sum of the thicknesses of the nitride semiconductor layer 13 and the intermediate layer 12. Thus, even if the intermediate layer 12 is recessed in the planar direction during etching of the nitride semiconductor layer 13 when the via hole 16 is formed, conduction failure of the via hole 16 is avoided by the ground electrode 45. Reduction in high frequency characteristics is thus avoided, and the nitride semiconductor device 104 can be manufactured with high yield.

The nitride semiconductor device 104A in Embodiment 4 includes the embedded layer 49 embedded in the via hole 16 via the ground electrode 15. The sum of the thicknesses of the ground electrode 15 at the bottom of the via hole 16 facing the electrode 14 and the embedded layer 49 is equal to or greater than the sum of the thicknesses of the nitride semiconductor layer 13 and the intermediate layer 12. Thus, even if the intermediate layer 12 is recessed in the planar direction during etching of the nitride semiconductor layer 13 when the via hole 16 is formed, conduction failure of the via hole 16 is avoided by the ground electrode 15 and the embedded layer 49. Reduction in high frequency characteristics is thus avoided, and the nitride semiconductor device 104A can be manufactured with high yield.

A method for manufacturing the nitride semiconductor device 104A in Embodiment 4 further includes (e) after the step (d), embedding the embedded layer 49 made of a metal or an alloy in the via hole 16 as the second via hole. The sum of the thicknesses of the ground electrode 15 at the bottom of the via hole 16 facing the electrode 14 and the embedded layer 49 is equal to or greater than the sum of the thicknesses of the nitride semiconductor layer 13 and the intermediate layer 12. Thus, even if the intermediate layer 12 is recessed in the planar direction during etching of the nitride semiconductor layer 13 when the via hole 16 is formed, conduction failure of the via hole 16 is avoided by the ground electrode 15 and the embedded layer 49. Reduction in high frequency characteristics is thus avoided, and the nitride semiconductor device 104A can be manufactured with high yield.

E. Embodiment 5

In Embodiments 1 to 4, opening portions of the large-diameter via holes 16*b* and 26*b* are vertical, and are thus sometimes difficult to be covered with the ground electrodes 15 and 45 to cause conduction failure. In contrast, in the present embodiment, a large-diameter via hole 16*b*1 is tapered.

E-1. Configuration

Figure 15:
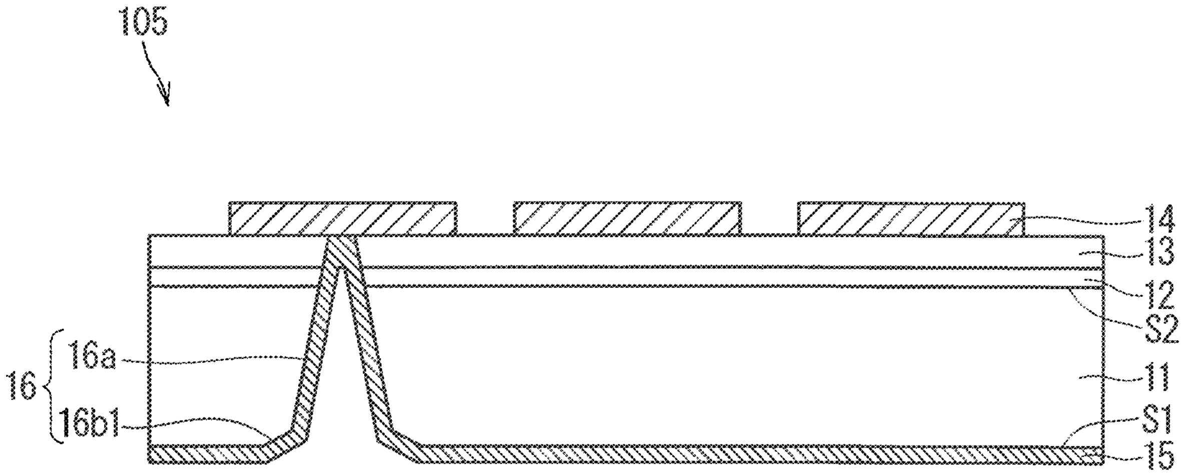
FIG. 15 is a cross-sectional view of a nitride semiconductor device in Embodiment 5.

FIG. 15 is a cross-sectional view of a nitride semiconductor device 105 in Embodiment 5. The nitride semiconductor device 105 differs from the nitride semiconductor device 101 in Embodiment 1 in that the tapered large-diameter via hole 16*b*1 is included in place of the large-diameter via hole 16*b*.

E-2. Manufacturing Steps

FIGS. 16 to 19 are schematic cross-sectional views for describing a method for manufacturing the nitride semiconductor device 105 in Embodiment 5. The method for manufacturing the nitride semiconductor device 105 will be described below with reference to FIGS. 16 to 19.

Figure 16:
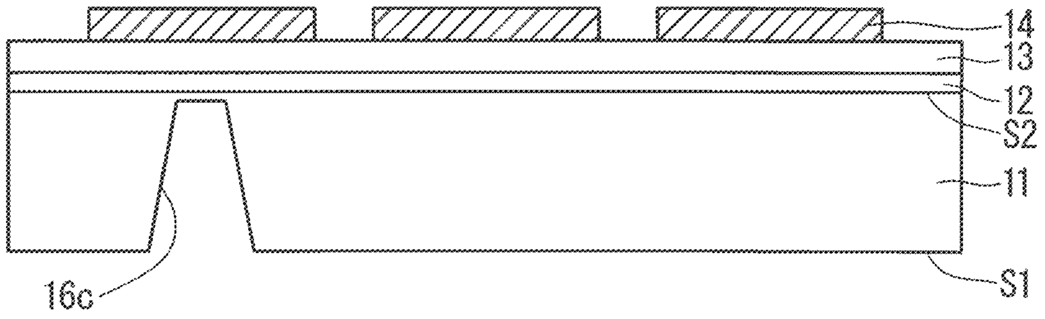
FIG. 16 is a cross-sectional view illustrating a method for manufacturing the nitride semiconductor device in Embodiment 5.

Steps to formation of the via hole 16*c* by laser processing illustrated in FIG. 16 are similar to those in Embodiment 1. After formation of the via hole 16*c*, an SiOx film 58 is formed over the first main surface S1 of the diamond layer 11 and in the via hole 16*c*. The SiOx film 58 is formed by plasma CVI) using tetraethyl orthosilicate (TEOS) as a raw material.

Figure 17:
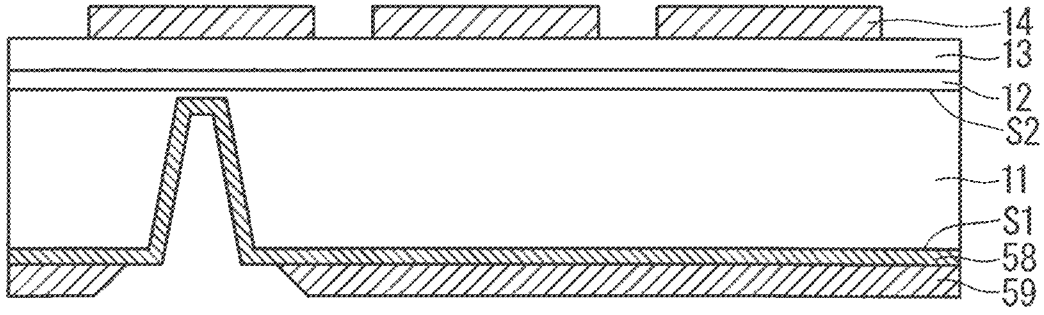
FIG. 17 is a cross-sectional view illustrating the method for manufacturing the nitride semiconductor device in Embodiment 5.

A photoresist 59 having a tapered opening cross section is then formed to obtain a configuration illustrated in FIG. 17. After application of the photoresist 59, the photoresist 59 is developed and, further, post-baked to be softened and to have the tapered opening cross section.

Figure 18:
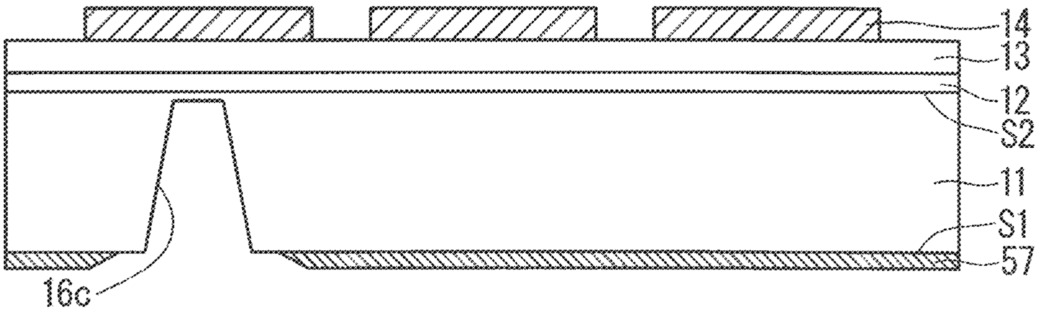
FIG. 18 is a cross-sectional view illustrating the method for manufacturing the nitride semiconductor device in Embodiment 5.

The SiOx film 58 is dry etched with the photoresist 59 as a mask, so that a mask 57 having a tapered opening cross section is obtained as illustrated in FIG. 18.

Figure 19:
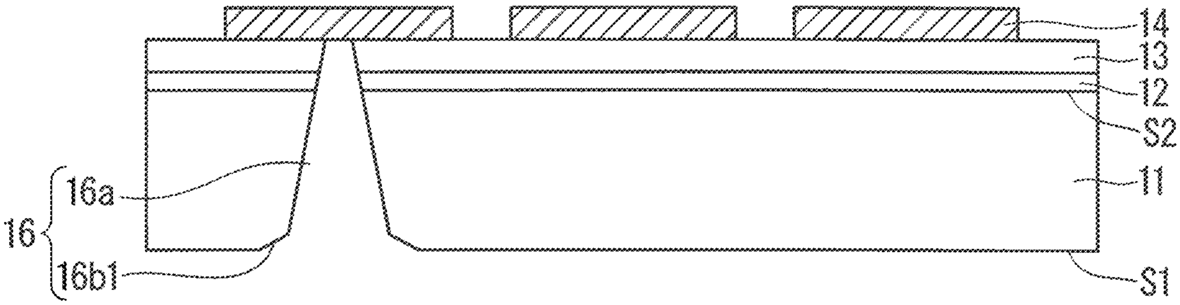
FIG. 19 is a cross-sectional view illustrating the method for manufacturing the nitride semiconductor device in Embodiment 5.

Dry etching is then performed using the mask 57, so that the diamond layer 11 at the bottom of the via hole 16*c*, the intermediate layer 12, and the nitride semiconductor layer 13 are removed to obtain the small-diameter via hole 16*a*, and a portion of the first main surface S1 of the diamond layer 11 exposed from an opening of the mask 57 is removed to obtain the tapered large-diameter via hole 16*bl*. The mask 57 is then removed as illustrated in FIG. 19.

Next, the ground electrode 15 is formed over the first main surface S1 of the diamond layer 11 and in the via hole 16. The large-diameter via hole 16*b*1 is tapered, so that the ground electrode 15 has good coverage over the large-diameter via hole 16*b*1. The nitride semiconductor device 105 illustrated in FIG. 15 is thus completed.

E-3. Effects

In the nitride semiconductor device 105 in Embodiment 5, the large-diameter via hole 16*b*1 is tapered. The ground electrode 15 thus has improved coverage over the large-diameter via hole 16*b*1, and conduction failure of the via hole 16 is suppressed. As a result, reduction in high frequency characteristics of the nitride semiconductor device 105 is suppressed, and the nitride semiconductor device 105 can be manufactured with high yield.

Embodiments can freely be combined with each other, and can be modified or omitted as appropriate. The foregoing description is in all aspects illustrative. It is understood that numerous unillustrated modifications can be devised.

EXPLANATION OF REFERENCE SIGNS

11 diamond layer, 12, 32 intermediate layer, 13 nitride semiconductor layer, 14 electrode, 15, 45 ground electrode, 16, 16*c*, 26, 26*c* via hole, 16*a*, 26*a* small-diameter via hole, 16*b*, 16*b*1, 26*b* large-diameter via hole, 17, 27 metal mask, 49 embedded layer, 57 mask, 58 SiOx film, 59 photoresist, 101-104, 104A, 105 nitride semiconductor device.

The invention claimed is:

1. A nitride semiconductor device comprising:
- a diamond layer;
- a back side electrode disposed over a first main surface of the diamond layer;
- an intermediate layer disposed over a second main surface of the diamond layer, the second main surface being a main surface opposite the first main surface;
- a nitride semiconductor layer disposed over a surface of the intermediate layer opposite the diamond layer; and
- an electrode disposed over a surface of the nitride semiconductor layer opposite the intermediate layer, wherein
- a via hole extends from the first main surface of the diamond layer through the diamond layer, the intermediate layer, and the nitride semiconductor layer to the electrode,
- the via hole has a stepped structure including a large-diameter via hole portion being in contact with the first main surface of the diamond layer and a small-diameter via hole portion continuous with the large-diameter via hole portion and facing the electrode such that a sidewall of the via hole includes an abrupt step or change in slope between the large-diameter via hole portion and the small-diameter via hole portion, the small-diameter via hole portion having a smaller diameter than the large-diameter via hole portion, and being tapered,
- the small-diameter via hole portion is concentric with the large-diameter via hole portion, and
- the intermediate layer is made of a nanocrystalline diamond, an oxide or a carbide of Si, an oxide or a nitride of Al or Ti, or an oxide of Hf or Zr.

2. The nitride semiconductor device according to claim 1, wherein
- a depth of the small-diameter via hole portion is equal to or greater than the sum of thicknesses of the intermediate layer and the nitride semiconductor layer.

3. The nitride semiconductor device according to claim 1, wherein
- a thickness of the back side electrode at a bottom of the via hole facing the electrode is equal to or greater than the sum of thicknesses of the nitride semiconductor layer and the intermediate layer.

4. The nitride semiconductor device according to claim 1, further comprising
- an embedded layer embedded in the via hole via the back side electrode, and
- the sum of thicknesses of the back side electrode at a bottom of the via hole facing the electrode and the embedded layer is equal to or greater than the sum of thicknesses of the nitride semiconductor layer and the intermediate layer.

5. The nitride semiconductor device according to claim 1, wherein
- the large-diameter via hole portion is tapered.

6. The nitride semiconductor device according to claim 1, wherein the abrupt step between the small-diameter via hole portion and the large-diameter via hole portion includes a flat portion that is parallel to the first main surface of the diamond layer.

7. A method for manufacturing a nitride semiconductor device, the method comprising:
- (a) forming a first via hole in a stack of a diamond layer, an intermediate layer, a nitride semiconductor layer, and an electrode stacked in this order by laser processing, the first via hole extending from a first main surface of the diamond layer not to the electrode, the first main surface being a surface opposite the intermediate layer;
- (b) forming a mask having an opening from which the first via hole as a whole and a portion of the first main surface of the diamond layer adjacent to the first via hole are exposed and which has a larger diameter than the first via hole;
- (c) processing the first via hole into a second via hole by dry etching with the mask; and
- (d) forming a back side electrode over the first main surface of the diamond layer and in the second via hole, wherein
- in the step (c), the second via hole is formed to have a stepped structure including a large-diameter via hole portion formed by removing the portion of the first main surface of the diamond layer exposed from the opening of the mask and a small-diameter via hole portion continuous with the large-diameter via hole portion and formed by extending the first via hole to the electrode, having a smaller diameter than the large-diameter via hole portion, and being tapered,
- the small-diameter via hole portion is concentric with the large-diameter via hole portion, and
- a sidewall of the second via hole includes an abrupt step or change in slope between the large-diameter via hole portion and the small-diameter via hole portion.

8. The method for manufacturing the nitride semiconductor device according to claim 7, wherein
- in the step (a), the first via hole is formed to extend through the diamond layer and the intermediate layer to the nitride semiconductor layer, and
- in the step (c), a portion of the nitride semiconductor layer overlapping the first via hole in plan view is removed to form the small-diameter via hole portion.

9. The method for manufacturing the nitride semiconductor device according to claim 7, wherein
- the intermediate layer is made of a nanocrystalline diamond, an oxide or a carbide of Si, an oxide or a nitride of Al or Ti, or an oxide of Hf or Zr.

10. The method for manufacturing the nitride semiconductor device according to claim 7, wherein
- a thickness of the back side electrode at a bottom of the second via hole facing the electrode is equal to or greater than the sum of thicknesses of the nitride semiconductor layer and the intermediate layer.

11. The method for manufacturing the nitride semiconductor device according to claim 7, the method further comprising (e) after the step (d), embedding an embedded layer made of a metal or an alloy in the second via hole, wherein the sum of thicknesses of the back side electrode at a bottom of the second via hole facing the electrode and the embedded layer is equal to or greater than the sum of thicknesses of the nitride semiconductor layer and the intermediate layer.

12. The method for manufacturing the nitride semiconductor device according to claim 7, wherein the large-diameter via hole portion is tapered.

13. The method for manufacturing the nitride semiconductor device according to claim 7, wherein the abrupt step between the small-diameter via hole portion and the large-diameter via hole portion includes a flat portion that is parallel to the first main surface of the diamond layer.

* * * * *